(12) United States Patent
Lai et al.

(10) Patent No.: US 7,358,883 B1
(45) Date of Patent: Apr. 15, 2008

(54) DYNAMIC BIAS CIRCUIT

(75) Inventors: Tin H. Lai, San Jose, CA (US); Wilson Wong, San Francisco, CA (US); Sergey Shumarayev, San Leandro, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/470,343

(22) Filed: Sep. 6, 2006

Related U.S. Application Data

(63) Continuation-in-part of application No. 11/355,678, filed on Feb. 15, 2006.

(51) Int. Cl.
*H03M 1/66* (2006.01)

(52) U.S. Cl. ...................................................... 341/144

(58) Field of Classification Search ................ 341/143, 341/144, 145
See application file for complete search history.

(56) References Cited

U.S. PATENT DOCUMENTS 7,167,117 B2* 1/2007 Choe ........................... 341/120
7,224,303 B2* 5/2007 Kwon ........................... 341/144
2006/0077140 A1* 4/2006 Kwon ............................ 345/77

* cited by examiner

*Primary Examiner*—Brian Young
(74) *Attorney, Agent, or Firm*—Martine Penilla & Gencarella, LLP

(57) ABSTRACT

A bias circuit includes a digital to analog converter (D2A) generating an output representing a voltage level for tuning an analog signal. The D2A is coupled to a primary register frame that includes a plurality of register frames that are serially linked. The bias circuit includes a decoder also coupled to the primary register frame. An output enable logic module is also included. The output enable logic module determines when the primary register has a complete data set as the data is shifted into the primary register frame from a memory region that may be a ROM, RAM, soft IP of a PLD, an intelligent host or tester serial data input stream. A method for adjusting a signal through a bias circuit is also provided.

20 Claims, 8 Drawing Sheets

DYNAMIC BIAS CIRCUIT

CROSS REFERENCE TO RELATED APPLICATION

This application is a continuation-in-part under 35 U.S.C. §120 and claims priority from U.S. patent application Ser. No. 11/355,678, entitled "DYNAMIC BIAS CIRCUIT," filed on Feb. 15, 2006, which is incorporated herein by reference for all purposes.

BACKGROUND

This application relates to integrated circuits and more particularly, to a dynamic bias circuit that is flexible, occupies a relatively small footprint, and can be adjusted to compensate for external variables.

Typical bias circuits suffer from a lack of capability of being fine-tuned or adjustable. In particular, these bias circuits may suffer from variations in temperature, supply voltages, and/or other process variations due to this lack of adjustability. That is, when any of these variations occur, the current bias circuits are unable to react to the changes as the output of the bias circuit is locked. One other shortcoming of current bias circuits is the relatively large footprint required for the circuit.

As a result, there is a need to solve the problems of the prior art to provide a bias circuit having a relatively small footprint and capable of being adjusted in response to any changing conditions that may affect the operation of the bias circuit or the signal the bias circuit may be adjusting.

SUMMARY

Broadly speaking, the present invention fills these needs by providing a dynamic bias circuit taking advantage of a single digital to analog converter. It should be appreciated that the present invention can be implemented in numerous ways, including as a method, a system, or an apparatus. Several inventive embodiments of the present invention are described below.

In one aspect of the invention, the bias circuit includes a digital to analog converter generating an output representing a voltage level for tuning an analog signal. The digital to analog converter is coupled to a primary register frame that includes a plurality of serially linked registers. Bit sequences are shifted from memory into registers of the primary register frame. The bias circuit includes a decoder also coupled to the primary register frame. The decoder selects one of a plurality of transmission gates that receive output from the digital to analog converter. An output enable logic module is also included in the bias circuit. The output enable logic module determines when the primary register has a complete data set as the data within the registers is shifting according to the clock period. The output enable logic module will assert an enable signal when the primary register has a complete data set therein. In one embodiment, the bias circuit is incorporated into a high-speed serial interface of a programmable logic device.

In another aspect of the invention, a method for adjusting multiple control knobs of an equalization circuit through a single digital to analog converter is provided. A plurality of registers in a primary register frame are serially linked, where the primary register frame has a bit sequence stored therein. The method includes identifying when the primary register frame has a complete bit sequence since the data within the primary register frame is shifting according to a clock period. Once the complete bit sequence is within the primary register frame, a first portion of the complete bit sequence is converted to a value representing an analog voltage. Contemporaneously with the converting of the first portion, a second portion of the complete bit sequence is decoded to activate a transmission gate corresponding to one of the multiple control knobs of the equalization circuit. The decoded signal and an enable signal triggered when the complete bit sequence is within the data chain are gated so that a particular transmission gate is activated and the corresponding control knob can be adjusted.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for a dynamic bias circuit. It will be obvious, however, to one skilled in the art, that the present invention may be practiced without some or all of these specific details. In other instances, well known process operations have not been described in detail in order not to unnecessarily obscure the present invention.

In one aspect of the invention, the bias circuit includes a digital to analog converter generating an output representing a voltage level for tuning an analog signal. The digital to analog converter is coupled to a primary register frame. The primary register frame is in communication with a memory region. The memory region may be a random access memory (RAM), a read-only memory (ROM) or shift registers within a programmable logic device (PLD) core, e.g., soft Intellectual Property (IP). In another embodiment, an external source, such as an intelligent host or external tester may function as the memory region. The bias circuit includes a decoder also coupled to the primary register frame. The decoder selects one of the plurality of transmission dates that receive output from the digital to analog converter. An output enable logic module is also included. The output enable logic module determines when the primary register has a complete data set as the data within the data chain is shifting according to the clock. The output enable logic module will assert an enable signal when the primary register has a complete data set therein. In one embodiment, the bias circuit is incorporated into a high speed serial interface of a programmable logic device.

The embodiments described herein include a dynamic bias circuit that consists of one n-bit digital-to-analog block, which provides one analog output with two resolutions between two referenced voltage levels. Here, n can be any integer equal to two or greater than two. The embodiments described below obtain X number of analog outputs through a single digital-to-analog converter, instead of using one digital-to-analog block for each output. In one embodiment, X number of n-bit registers, combined with a single digital-to-analog converter block can be utilized through time domain multiplexing. In another embodiment, a memory region either internal or external to the chip containing the bias circuit provides the bit sequence for the single digital to analog converter block and decoder. In addition, the dynamic bias circuit described herein is temperature invariant, as well as tolerant to other external conditions due to the dynamic features. With the ability to adjust voltage level of each output of a corresponding equalizer circuit that is used to adjust an attenuated analog signal, the design described herein can be used to combat a drop or increase of supply voltages, as well as any other process variation. In one embodiment, this feature is useful to apply to analog or digital test inputs to avoid the need for input probing.

Figure 1:
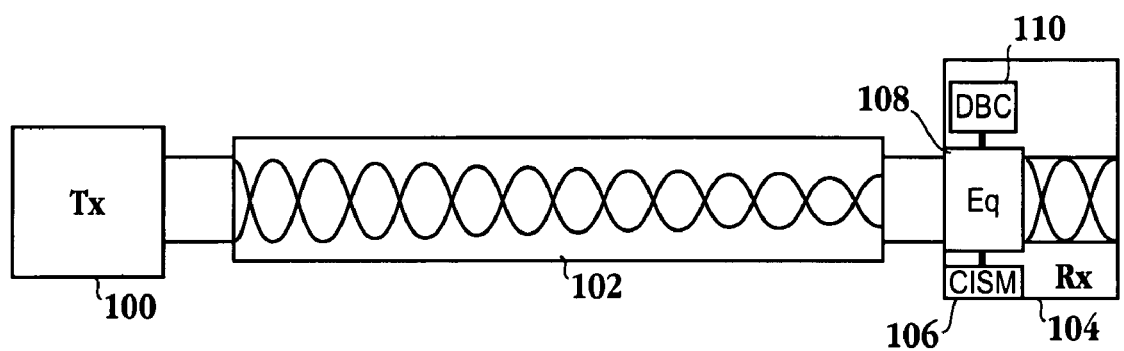
FIG. 1 is a simplified schematic diagram illustrating a signal being reshaped after traversing a back plane in accordance with one embodiment of the invention.

FIG. 1 is a simplified schematic diagram illustrating a signal being reshaped after traversing a back plane in accordance with one embodiment of the invention. Transmit module 100 will transmit a signal having a certain output shape to ultimately be received by receive module 104. The signal traverses back plane 102 and may become attenuated depending on the conditions, the length of the back plane, etc. Receive module 104 reshapes the signal through equalizer 108. Equalizer 108 is operatively connected to dynamic bias circuit 110 and comparator/state machine 106. Through dynamic bias circuit 110, the signal received by receive module 104 is reshaped so that the output is amplified in order to compensate for losses during transmission through back plane 102. As will be described in more detail below, dynamic bias circuit 110 outputs a number of signals to the control knobs of equalizer 108 in order to adjust and reshape the signal. Dynamic bias circuit 110 incorporates a single digital to analog block rather than having a digital analog block dedicated to each control knob of equalizer 108. That is, the single digital-to-analog block is shared among the knobs of the equalizer.

In one embodiment, the digital-to-analog block is separate from the remainder of the circuit making up dynamic bias circuit 110 of FIG. 1, i.e., the digital-to-analog block is not integrated within the dynamic bias circuit. It should be appreciated that in this embodiment, where the digital-to-analog converter is not integrated into the dynamic bias circuit, all the remaining circuitry of the dynamic bias circuit can be constructed within an intellectual property (IP) core of an integrated circuit and the digital-to-analog converter can be located external to this IP core. Dynamic bias circuit 110 includes a memory region capable of storing a plurality of frames of data. Each frame of data may be associated with a corresponding control knob of the equalizer. In addition, it should be appreciated that the embodiments described herein eliminate the use of a manual bypass multiplexer in every equalizer control knob.

Figure 2:
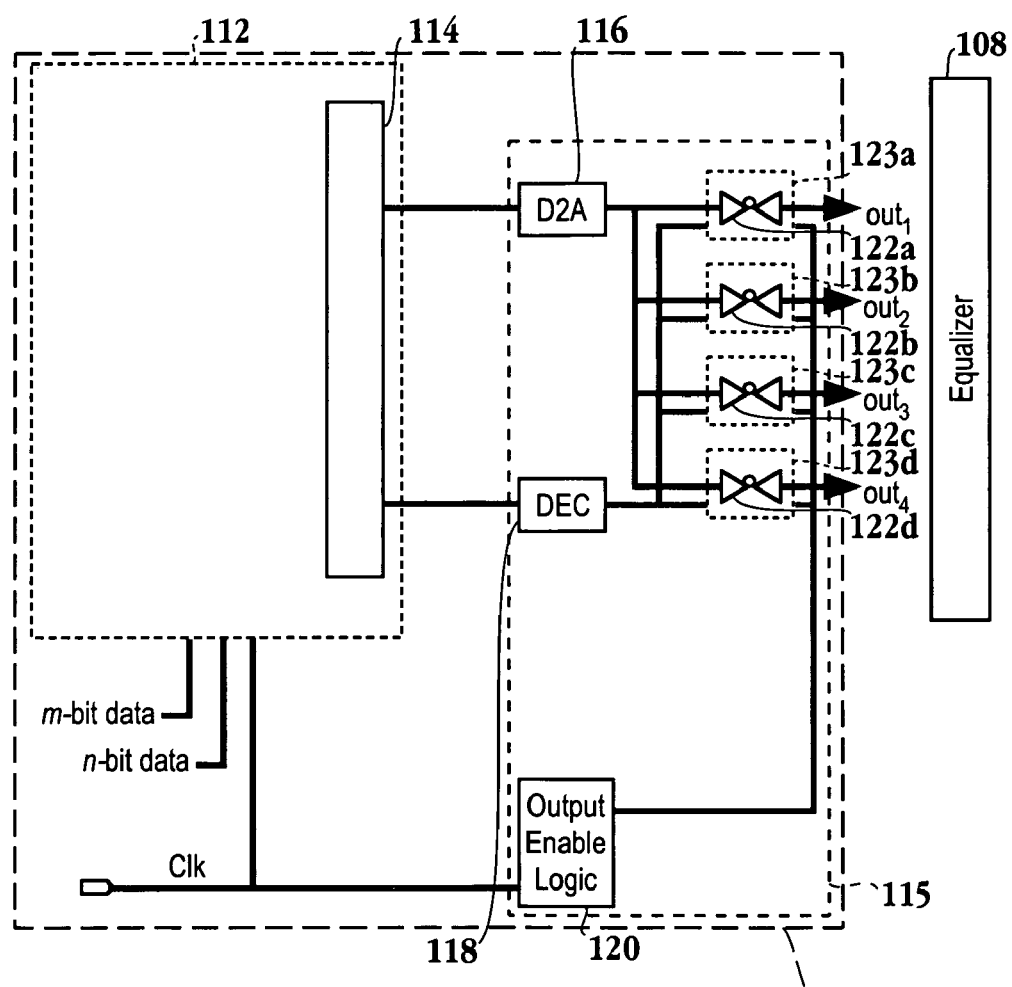
FIG. 2 is a more detailed diagram illustrating the components of the dynamic bias circuit in accordance with one embodiment of the invention.

FIG. 2 is a more detailed diagram illustrating the components of the dynamic bias circuit in accordance with one embodiment of the invention. Dynamic bias circuit 110 includes memory region 112 and equalization control circuitry 115. Memory region 112 may be a random access memory, read-only memory, or other memory which may be internal to the dynamic bias circuit or external to the dynamic bias circuit. It should be appreciated that memory region 112 is showing being internal or integrated within the dynamic bias circuit for illustrative purposes only in FIG. 2 and is not meant to be limiting. Memory region 112 includes a number of frames of data. Each frame within memory region 112 includes a portion represented by m-bits and another portion represented by n-bits as will be explained further with regard to FIG. 3. Memory region 112 communicates the corresponding m and n bit portions to primary register frame 114. It should be appreciated that the number of m-bits is associated with the number of knobs on equalizer 108 that can be connected to the outputs from the dynamic bias circuit 110. Thus, where equalizer 108 includes four knobs to be controlled, m will be 2 bits, i.e., $2^2$. Where equalizer 108 includes eight control knobs, m will be 3 bits, i.e., $2^3$, and so on. In addition, depending on the granularity of control desired for adjusting the analog signal, the number of bits represented by n impacts this degree of granularity. For example, if the range of adjustment is desired to be subdivided into 256 steps, the number of bits represented by n is 8, i.e., $2^8$ equals 256. Thus, the voltage range, which may be represented by 0-1.2 volts in one exemplary embodiment, may be subdivided into 256 steps or sub-units. It should be noted that the specific examples provided herein for the size of the bit sequences are shown for exemplary purposes only and are not meant to be limiting.

Continuing with FIG. 2, equalization control circuitry 115 includes decoder 118, output enable logic module 120, and output ports 123a through 123d. Output ports 123a-d include respective transmission gates 122a-d as well as other output port gate circuitry specified in more detail with reference to FIG. 3. In addition, equalization control circuitry 115 illustrates digital-to-analog converter 116, however, as mentioned previously, digital-to-analog controller 116 may be placed outside of the IP core from the remainder of the circuitry for dynamic bias circuit 110. In one embodiment, the externally supplied updates may originate from a read only memory (ROM). Thus, as opposed to prior art bias circuits, memory 112 is dynamic, in the sense that the values provided to the digital-to-analog converter 116 can be changed through time domain multiplexing or other suitable means. Digital-to-analog converter 116 is operatively coupled with primary register frame 114, which includes a plurality of registers. One skilled in the art will appreciate that the registers may be flip-flops, latches, or other storage elements used in memory. As illustrated, a portion of the entire bit sequence within primary register frame 114 is provided to digital to analog converter 116. The number of bits or the bit sequence in primary register frame 114 will correlate to a certain output for digital-to-analog converter 116, which is then communicated to each of output ports 123a-d and corresponding input ports 122a-d, to eventually be applied to respective control knobs of equalizer 108.

Still referring to FIG. 2, during each clock cycle, the data within memory region 112 and primary register frame 114 may be shifted. Thus, during successive clock cycles, the bits within each storage element of memory 112 can be updated or modified so that the contents of primary register frame 114 are eventually updated. Ultimately a new bit sequence is provided to digital-to-analog converter 116 resulting in a different signal being output from digital-to-analog converter 116. Output enable logic module 120 is tied to the same clock signal as register chain 112 and tracks the clock cycles, e.g., through a counter, in order to determine when an enable period has been completed, i.e., all of the bits have been shifted into primary register frame 114 so that the primary register frame 114 has a complete bit sequence. In response to determining that the enable period has been completed and primary register frame 114 has a complete bit sequence, output enable logic module 120 asserts an enable signal to each of output ports 123a-d.

Continuing with FIG. 2, each register within primary register frame 114 includes a bit sequence having a portion represented by n bits and a portion represented by m bits. The n bit sequence is provided as the input to digital to analog converter 116, while the m bit sequence is provided to decoder 118. Decoder 118 is used to select one of output ports 123a-d that will be used to output the data to a corresponding control knob of equalizer 108. In other words, decoder 118 selects which knob of equalizer 108 is being adjusted. Output enable logic block 120 generates the enable signal, which is gated with the output of decoder 118, as discussed in more detail with reference to FIG. 3. In one embodiment, the frames within memory region 112 may periodically repeat with the same information in order to more finely tune the output from equalizer 108. Consequently, the same control knobs would be selected through decoder 118 to adjust the corresponding control knob every second cycle rather than every fourth cycle. One skilled in the art will appreciate that numerous combinations and configurations for the bit sequences within the frames of memory 112 can accommodate any number of desired sequences.

Figure 3:
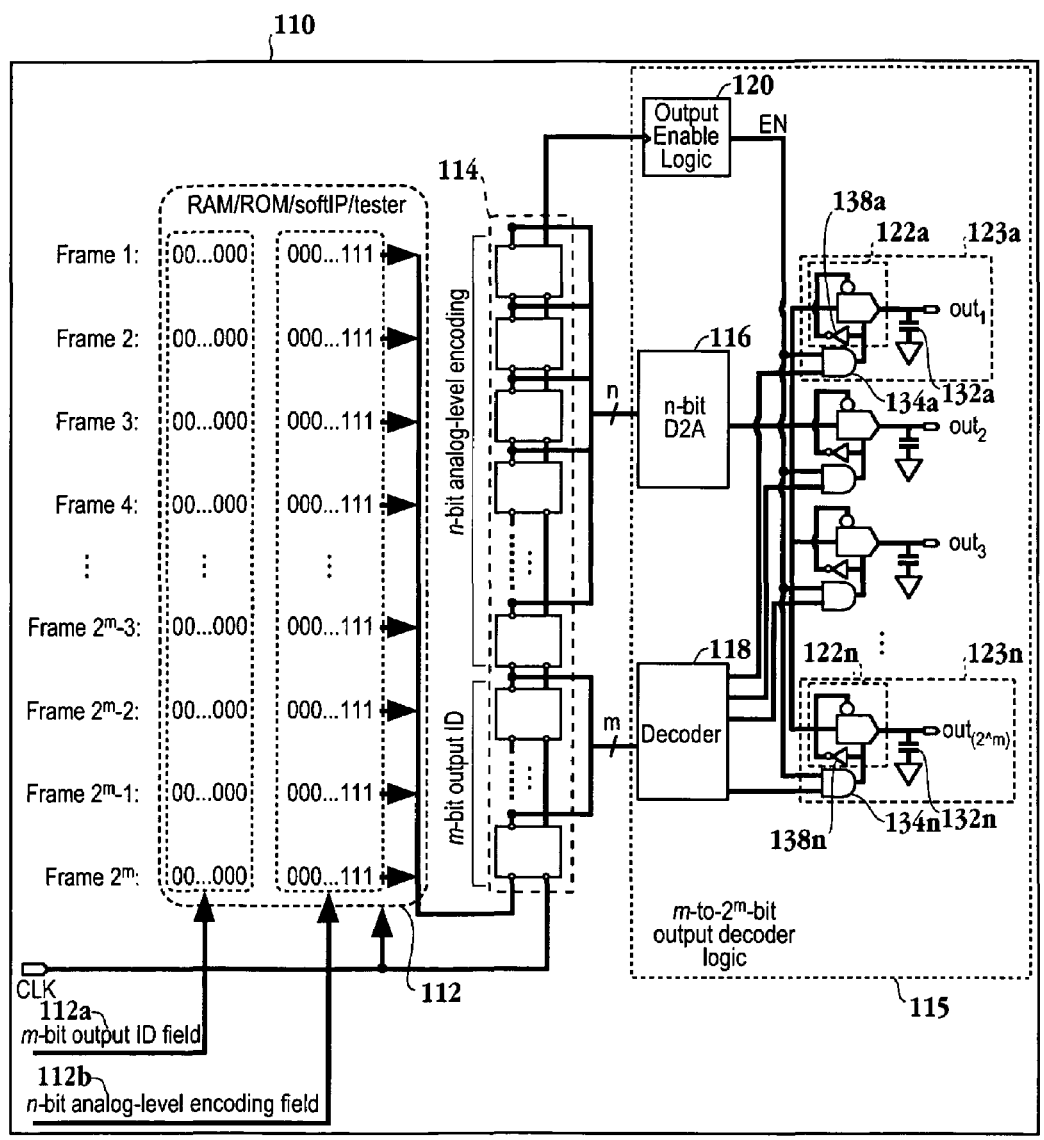
FIG. 3 is a simplified schematic diagram showing an alternative embodiment of the dynamic bias circuit illustrated in FIG. 2.

FIG. 3 is a more detailed schematic diagram illustrating the components of the dynamic bias circuit of FIG. 2. In FIG. 3, memory region 112 includes a plurality of frames and is apportioned as an m region associated with an m bit output ID field 112a and an n region associated with an n bit analog level encoding field 112b. M region 112a includes m-bits associated with the number of knobs on equalizer 108 that can be connected to the outputs from dynamic bias circuit 110. Thus, where equalizer 108 includes four knobs to be controlled, m will be two bits, i.e., $2^2$. Where equalizer 108 includes eight control knobs, m will be three bits, i.e., $2^3$, and so on. In addition, depending on the granularity of control desired for adjusting the analog signal, the number of bits represented by n impacts this degree of granularity. For example, if the range of adjustment is desired to be subdivided into 256 steps, the number of bits represented by n is 8, i.e., $2^8$ equals 256. Thus, the voltage range which may be represented by 0 to 1.2 volts in one exemplary embodiment may be subdivided into 256 steps or sub-units. It should be noted that the specific examples provided above for the size of the bit sequences are shown for exemplary purposes only, and are not meant to be limiting.

Further detail is provided for each of output ports 123a-d and transmission gates 122a through 122d of FIG. 2 in FIG. 3. Output port 123a includes transmission gate 122a, AND gate 134a, inverter 138a and capacitor 132a. Capacitor 132a is used to hold the voltage level signal to be provided to corresponding equalizer knob and to refresh the value held within transmission gate 122a. As illustrated in FIGS. 2 and 3, a number of m+n frames, which each may be referred to as a single data frame, is needed for each analog output. Each data frame consists of two groups: n-bit analog level encoding bits 112b and m-bit output identification bits 112a. A corresponding larger n number is required to employ higher resolution digital-to-analog converter. The number of m bits is chosen to sufficiently identify a maximum number of $2^m$ outputs. Output enable logic block 120 is designed to issue pulse data, i.e., enable signals, typically no more than one clock period. The period of the enable signals is m+n times the clock period and may be tracked by the output enable logic through counters or some other suitable circuitry for tracking the clock cycles. In one embodiment, the enable signal is disabled before one frame of data (m+n bits) that specifically belong to one output, begins to shift out of the primary register in order to provide for a more stable output. As one frame of data, i.e., a complete bit sequence, is shifted entirely into primary register frame 114, the enable signal is asserted through output enable logic module 120. Digital-to-analog converter 116 generates the analog level and output decoder 118 allows the refresh of the output with the correct identification. As illustrated in FIG. 3, each output port 123a-n has a corresponding capacitor 132a-n used to maintain and at the same time, stabilize the signal output. As other data frames alternatively cycle through, the time domain multiplexing described herein enables many outputs to stay at different analog levels.

Still referring to FIG. 3, new programming content can be updated by exercising, i.e., asserting, the update signal without disrupting the refresh cycle through the output. Accordingly, fine-tuned adjustments are possible. In one embodiment, the update signal is asserted and data is supplied from an intelligent host/tester or the core's random access memory (RAM) or read-only memories (ROM). In one embodiment, the output identification allows certain output to be refreshed at a higher rate than others if necessary. This means allowing more frames to the same output in one large cycle. As described above, the bit sequence for multiple frames may be the same to achieve the higher rate of refreshing. In another embodiment, a faster clock can be selected for more leaky charge storage elements at the output. Thus, the design is process scalable.

Alternatively, the bias circuit described above can be used to test leaky processes, i.e., metal capacitors. One skilled in the art will appreciate that if the timing domain multiplexing is suppressed, i.e., stopping the clock signal at enable active, a passive bias circuit is provided having one analog output with fine adjusting capability. It will be apparent to one skilled in the art that numerous configurations are possible with the structure of the data frames and the bit sequences stored therein.

Figure 4A:
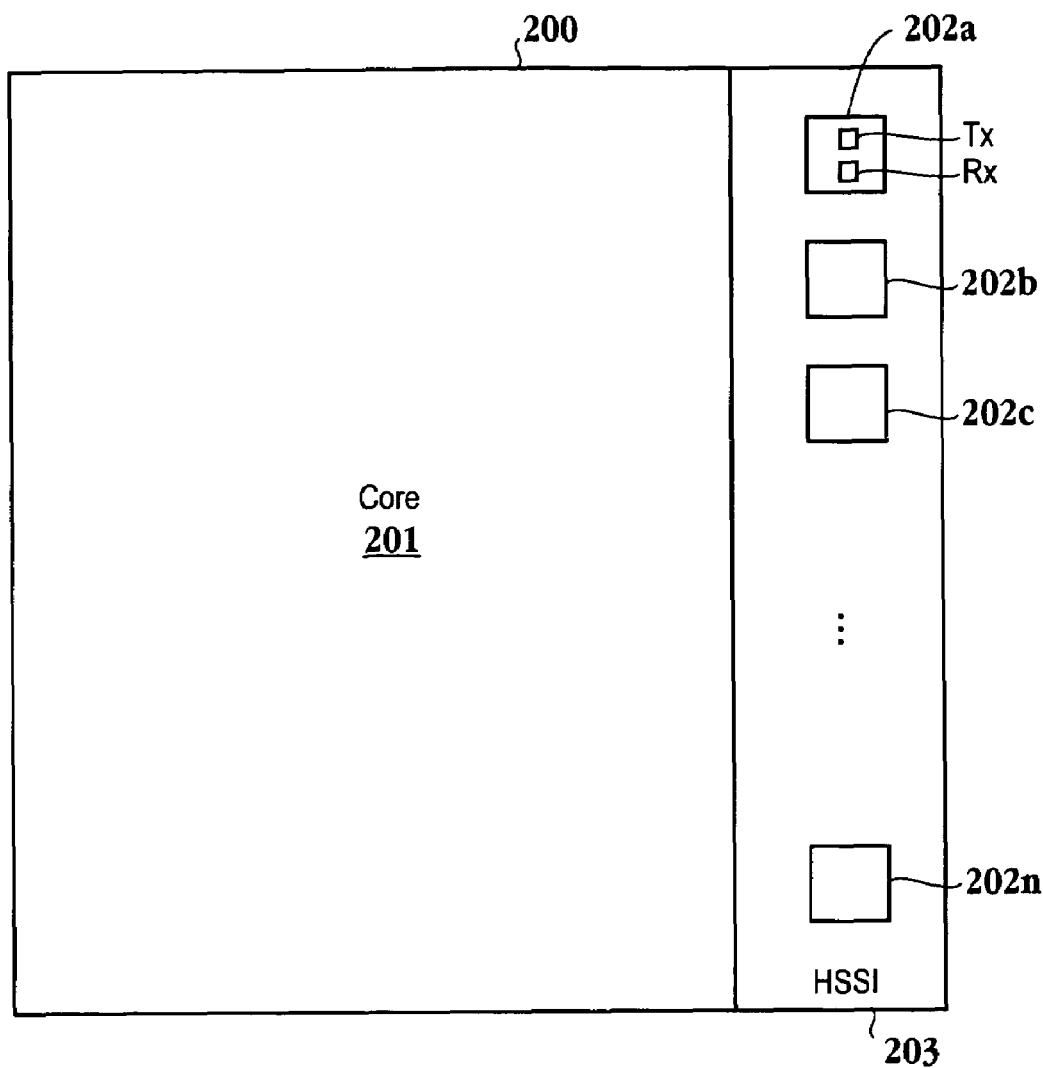
FIG. 4A is a high-level schematic diagram of a particular use of the bias circuit in accordance with one embodiment of the invention.

FIG. 4A is a high-level schematic diagram of a particular use of the bias circuit in accordance with one embodiment of the invention. Programmable logic device 200 includes core 201 and high-speed serial interface 203. It should be appreciated that core 201 may be structured as the architecture for any integrated circuit, including the architecture of a field programmable gate array (FPGA), such as the STRATIX family of FPGAs owned by the assignee. High-speed serial interface 203 includes a number of serial de-serializer channels 202a through 202n. Each serializer de-serializer channel includes a transmit port and a receive port.

Figure 4B:
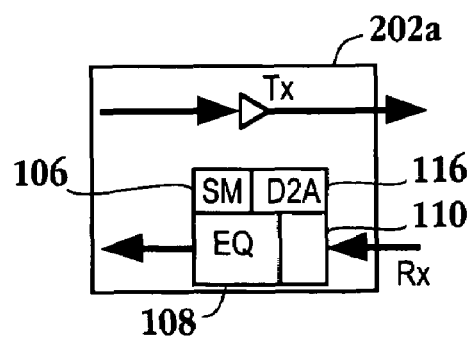
FIG. 4B shows a more detailed diagram of a particular serializer deserializer channel of FIG. 4A.

FIG. 4B shows a more detailed diagram of a particular serializer de-serializer channel of FIG. 4A. On the receive side of the serializer de-serializer channel 202a, the dynamic bias circuit is incorporated therein. Thus, dynamic bias circuit 110 is provided along with equalizer 108, digital-to-analog converter 116, and state machine 106. It should be noted that any signal coming into programmable logic device 200, which has been attenuated due to any circumstances, can be reshaped in order to provide programmable logic device 200 with an accurate signal.

Figure 5:
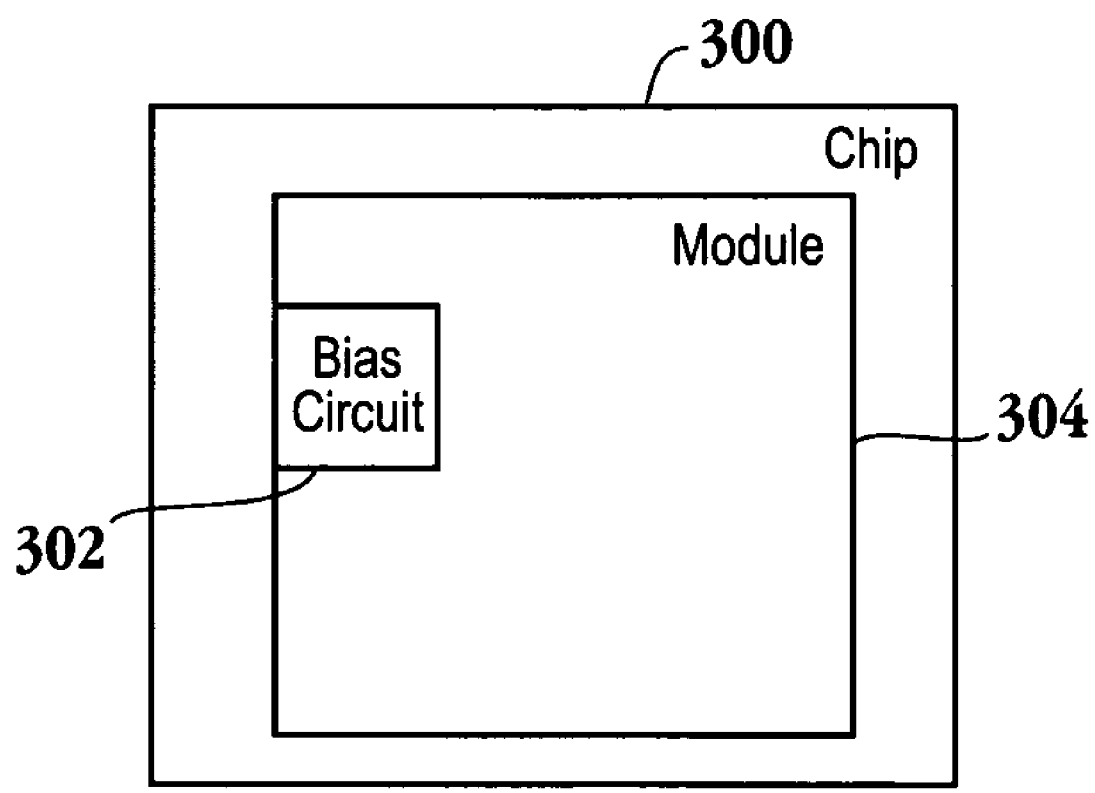
FIG. 5 is a high-level schematic diagram illustrating the dynamic bias circuit for use within any semiconductor chip.

FIG. 5 is a high-level schematic diagram illustrating the dynamic bias circuit for use within any semiconductor chip. Semiconductor chip 300 may include any sub-chip 304 or any other module in which an analog signal is provided to the sub-chip or module. Bias circuit 302 can be used to adjust or reshape the signal being provided to sub-chip 304 in order to provide for an accurate input into sub-chip 304. Thus, bias circuit 304 would include a memory region and the equalization control circuitry illustrated with reference to FIGS. 2 and 3. Of course, not all the functionality need be contained within bias circuit 302. As mentioned above, the digital-to-analog converter may be located in a non-core area of semiconductor chip 304, while the remainder of the bias circuit is defined in an IP core of the semiconductor chip. In addition, the memory region may be located external to the semiconductor chip.

The RAM/ROM/soft IP/tester block of the embodiments described above imply source data resides in a random access memory or read-only memory or from shift registers in a programmable logic device core IP, or from external sources such as an intelligent host or tester serial data input stream. With regard to U.S. application Ser. No. 11/355,678, which is incorporated herein by reference for all purposes, the embodiments described herein can provide for more compact data storage, i.e., the data resides in RAM/ROM/hard disk resource and is smaller in area than the shift register chain of U.S. application Ser. No. 11/355,678. The number of outputs supported (maximum number $2^m$) and the number of bits for analog level encoding (n), and also the number of data frames are not limited by a fixed length shift register chain. In addition, the ability to ground unused bits in the output selection control output (m-bit output) and bypass unused registers in the primary register output selection section (portion of the primary register frame storing the m-bits) eliminates the need for a dummy bit to fill a fixed shift register frame size.

Figure 6:
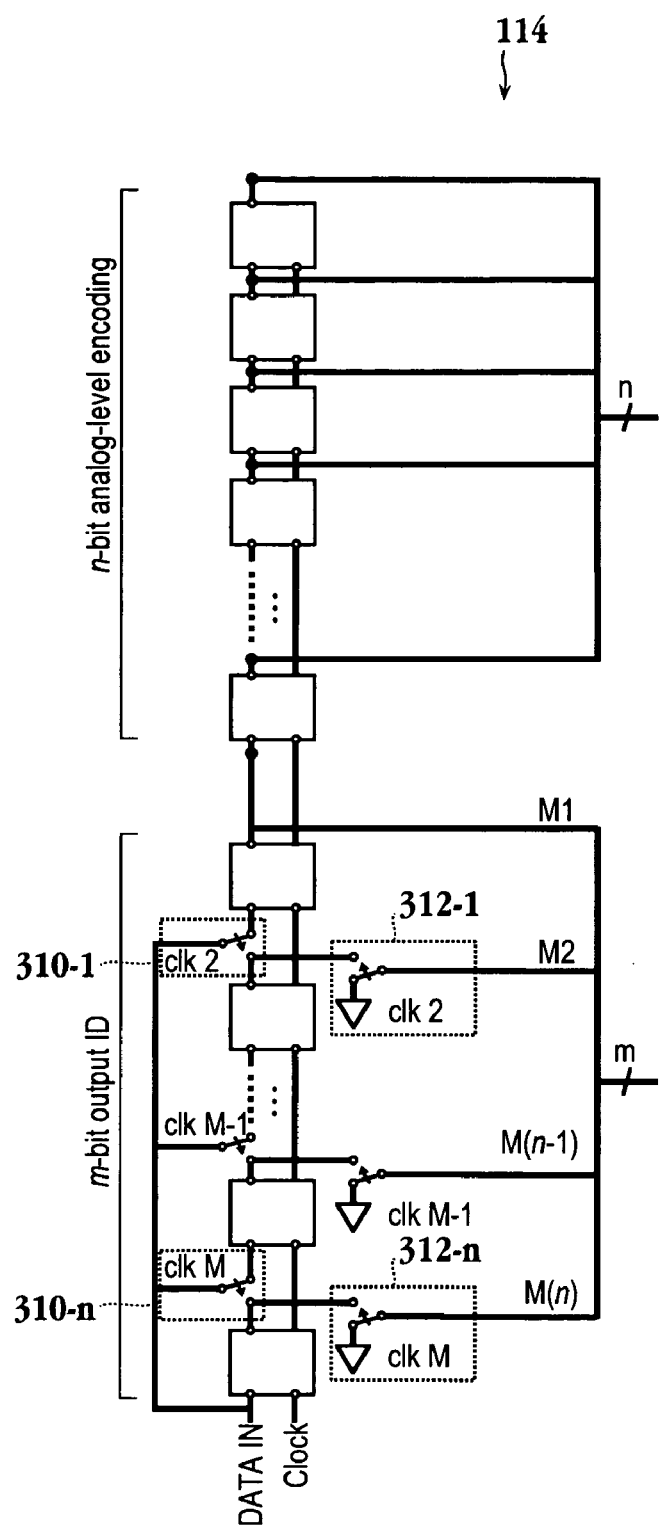
FIG. 6 is a simplified schematic diagram illustrating the primary register operating in shift register mode in accordance with one embodiment of the invention.

FIG. 6 is a simplified schematic diagram illustrating the primary register operating in shift register mode in accordance with one embodiment of the invention. Here, the m-bit output ID includes switches 310-1 through 310-n and 312-1 through 312-n, so that certain registers within primary register frame 114 may be bypassed in order to accommodate different lengths of m bits. Accordingly, switches 310-1 through 310-n and 312-1 through 312-n may be configured to bypass any registers and ground the outputs of those registers within m-bit portion of primary register frame 114. One skilled in the art should appreciate that the embodiments described herein provide complete flexibility on the refreshing schedule assignment due to the larger number of data frames available through the memory region 112. The user can arrange data frames within memory region 112 to specify how much and how frequently some output will be refreshed more than others. That is, the data within memory region 112 may periodically repeat so that certain signals may be refreshed more than others. In one embodiment where memory region 112 is a RAM or an intelligent host/tester, the refreshing schedule can be updated by updating the RAM content or data from the intelligent host/tester. As mentioned above, the data can also be utilized to use unused PLD resources located remotely from the primary register/digital-to-analog converter/output logic which could potentially reside in a critical location such as a serializer de-serializer.

Figure 7A:
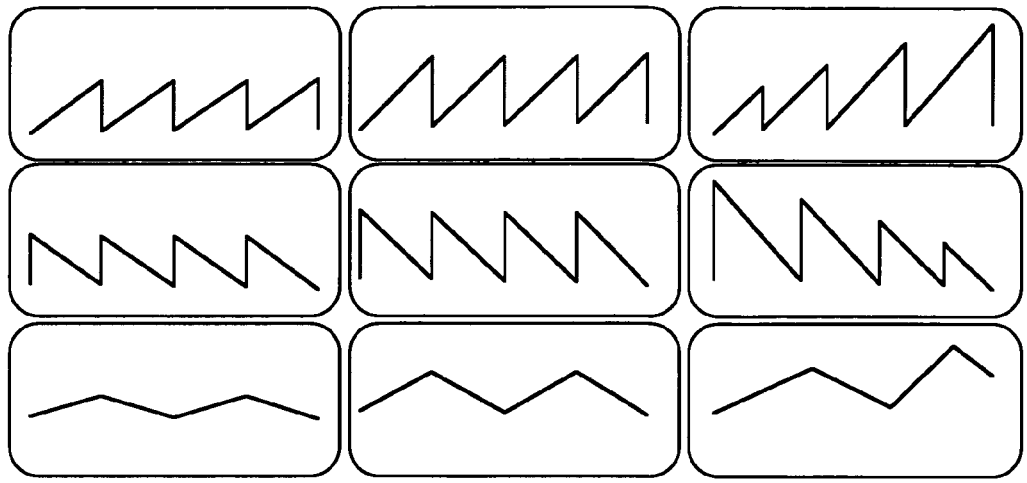
FIG. 7A is a simplified schematic diagram illustrating the ability to provide arbitrary digital input sequences by changing one bit at a time in accordance with one embodiment of the invention.

FIG. 7A is a simplified schematic diagram illustrating the ability to provide arbitrary digital input sequences by changing one bit at a time in accordance with one embodiment of the invention. The wave forms illustrated by OUT1 through OUT($2^m$) illustrates various waveforms provided by changing one bit of the digital input sequence. Through manipulation of the bit sequence within the memory region, numerous patterns for waveforms may be generated. These patterns may be used to control a state machine. In one embodiment, the state machine may be able to select from the different waveform outputs. In another embodiment, the embodiments described herein are capable of providing an arbitrary digital input sequence with one bit changed at a time.

Figure 7B:
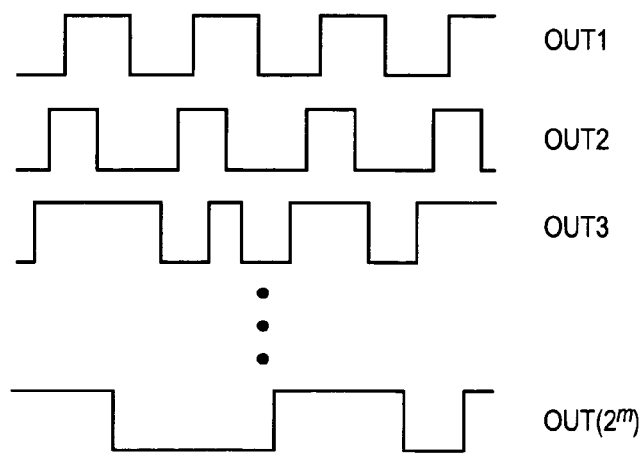
FIG. 7B illustrates alternative output shapes when the primary register frame is operated in binary counter mode in accordance with one embodiment of the invention.

FIG. 7B illustrates alternative output shapes when the primary register frame is operated in binary counter mode in accordance with one embodiment of the invention. In this embodiment, enabling Counter_enable during a certain number of clock cycles, together with the proper control of UP or DOWN/CLEAR a user may obtain the output shapes as illustrated in FIG. 6B, as well as numerous other output shapes. It should be appreciated that this embodiment provides the ability to perform a DC sweep at output with a programmable precise sweep range. This capability may be used to characterize gate input trip points, RAM/CRAM trip points, sense amplifier functionality, hysteresis levels, or provide analog characterization control input to modules such as an equalizer or voltage control oscillator.

Figure 8:
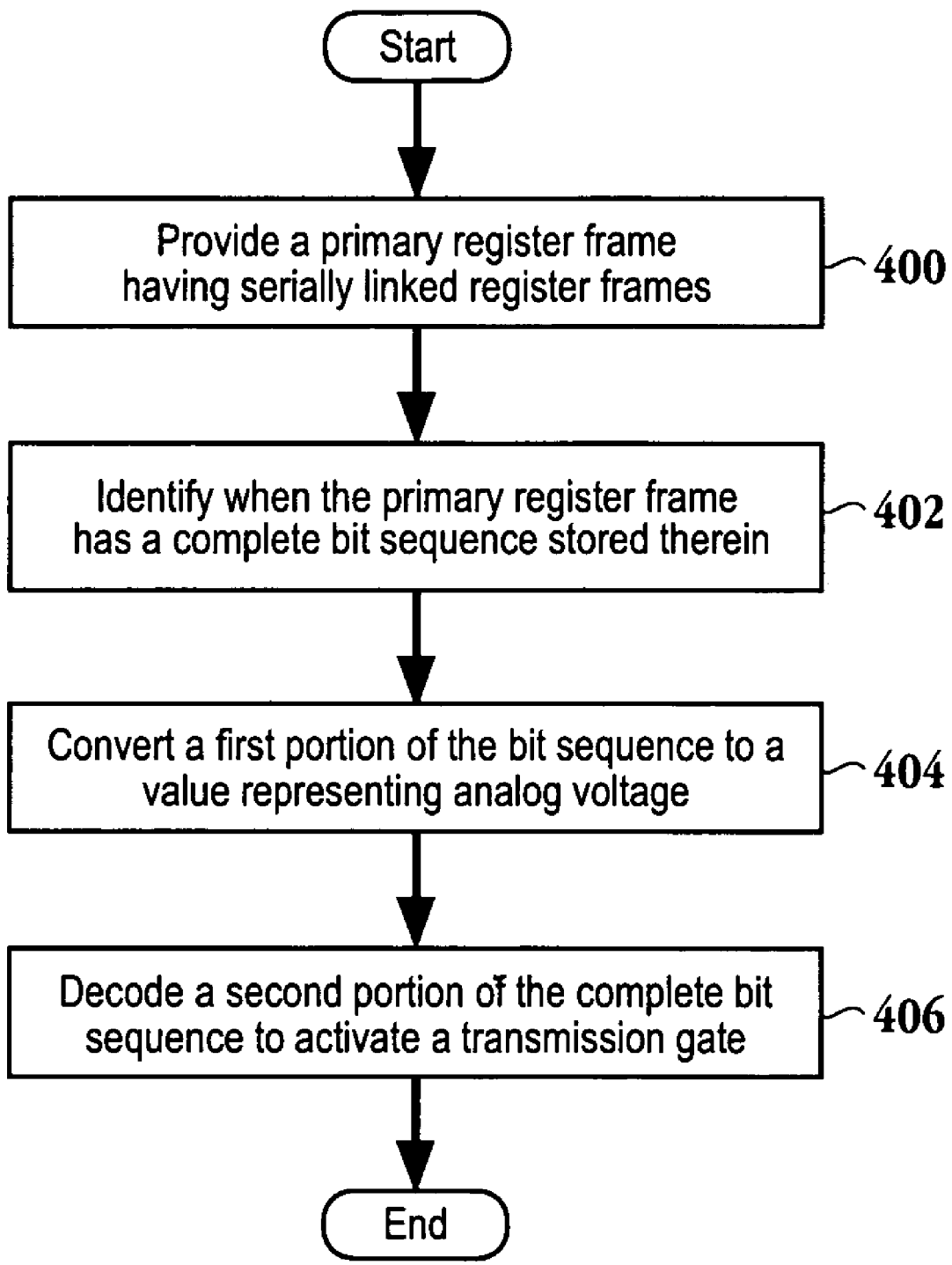
FIG. 8 is a flow chart diagram illustrating the method operations for adjusting multiple control knobs of an equalization circuit through a single digital analog converter in accordance with one embodiment of the invention.

FIG. 8 is a flow chart diagram illustrating the method operations for adjusting multiple control knobs of an equalization circuit through a single digital analog converter in accordance with one embodiment of the invention. The method initiates with operation 400 where a primary register frame, where each register of the primary register is serially linked. The primary register is in communication with a memory region containing frames of data that is shifted into the primary register as illustrated with reference to FIGS. 2 and 3. The method advances to operation 402 where it is identified when the primary register frame has a complete bit sequence stored therein. As discussed above, the data within the primary register frame is shifted on each clock cycle and as the data from one frame is completely moved into the primary register frame, the output enable logic module will identify the completion of this movement. In one embodiment, if there are m+n bits in each register frame and the bits are shifted one position each clock cycle, then a complete frame will occur each m+n clock cycles. Accordingly, as mentioned above, the output enable logic module will assert an enable signal when a complete bit sequence has been shifted into one of the register frames.

The method of FIG. 8 then proceeds to operation 404 where a first portion of the complete bit sequence is converted to a value representing an analog voltage. Here, the n corresponding bit are provide to a digital-to-analog converter and this bit sequence is used to establish an output from the digital-to-analog converter that will be used to adjust a signal received by an equalization circuit. The resolution provided by the digital-to-analog circuit will be proportional to the number of bits in the first portion bit sequence. The method then moves to operation 406 where a second portion of the complete bit sequence is decoded to activate a transmission gate corresponding to one of the multiple control knobs. The second portion here refers to the m number of bits, which is provided to a decoder in order to identify the transmission gate for the respective output port. In one embodiment, the decoder output and the output from the output enable logic module are gated as illustrated with reference to FIG. 3, in order to select the appropriate transmission gate to deliver the output voltage to the desired control knob of an equalization circuit.

In summary, the above-described invention provides a dynamic bias circuit and a method for a adjusting multiple control knobs of an equalization circuit through a single digital to analog converter. The embodiments provide a bias circuit having an n-bit digital to analog converter that provides one analog output with $2^n$ resolution between two reference voltage levels. Through the digital to analog converter, X outputs are provided, where X is an integer that is greater than or equal to 2, instead of using one digital to analog converter for each output. The use of a single digital to analog converter is achieved in combination with serially linked register frames having n bits for the digital to analog converter and m bits sufficiently large enough to identify each of the X outputs. One skilled in the art will appreciate that the bias circuit described above may be utilized to adapt to changing environmental conditions by updating the memory providing the data to the serially linked register frames. Thus, changing conditions including temperature, pressure, supply conditions, etc., can all be adjusted and the bias circuit is not locked into a setting once that setting is established.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A bias circuit for adjusting a signal, comprising:
   a plurality of transmission gates;
   a digital to analog converter providing an output shared among the plurality of transmission gates, the output determining a voltage level for adjusting an analog signal;
   a bank of registers providing input to the digital to analog converter, the input determining the voltage level, wherein data stored within the bank of registers is periodically shifted thereby rotating the input provided by the bank of registers; and
   a memory region in communication with the bank of registers, the memory region sequentially shifting data into the bank of registers.

2. The bias circuit of claim 1, further comprising:
   a decoder for selecting one of the transmission gates to provide corresponding output to an external circuit.

3. The bias circuit of claim 1, wherein the bank of registers includes a first bit sequence portion and a second bit sequence portion, the first bit sequence portion provides the input to the digital to analog converter, the second bit sequence portion provides input to a decoder for selecting one of the transmission gates.

4. The bias circuit of claim 1, further comprising:
   output enable logic module determining a completion of sequentially shifting the data into the bank of registers to generate an enable signal for the plurality of transmission gates.

5. The bias circuit of claim 1, wherein each of the plurality of transmission gates is associated with an AND gate, a first input into the AND gate coupled to a decoder and a second input into the AND gate coupled to an output enable logic module.

6. The bias circuit of claim 1, wherein the memory region is selected from one of a random access memory or a read only memory.

7. The bias circuit of claim 1, wherein the bias circuit is incorporated into a high speed serial interface of a programmable logic device.

8. The bias circuit of claim 1, wherein the memory region is located off-chip from the plurality of transistor gates, the digital to analog converter and the bank of registers.

9. The bias circuit of claim 1, wherein the external circuit is an equalizer.

10. A bias circuit for providing signals for an equalization circuit, comprising:
    a digital to analog converter generating an output representing a voltage level for tuning an analog signal; and
    a primary register frame providing input to the digital to analog converter, wherein registers within the primary register frame are serially linked and data is shifted into the primary register frame so that the output from the digital to analog converter can be shared by control knobs of the equalization circuit.

11. The bias circuit of claim 10, further comprising:
    a decoder coupled to the primary register frame, the decoder activating a data path corresponding to one of the control knobs.

12. The bias circuit of claim 11, wherein a portion of a bit sequence within the primary register frame is input into the digital to analog converter and a remainder of the bit sequence is input into the decoder.

13. The bias circuit of claim 10, further comprising:
    a memory region in communication with the primary register frame, the memory region sequentially shifting data into the primary register frame.

14. The bias circuit of claim 10, further comprising:

an output enable logic module, the output enable logic module determining when a complete frame of data has been shifted into the primary register frame.

15. The bias circuit of claim 14, further comprising:

a plurality of output ports, each of the plurality of output ports having a transmission gate receiving output from the digital to analog converter and each transmission gate is gated with inputs received from the decoder and the output enable logic module.

16. A method for adjusting multiple control knobs of an equalization circuit through a single digital to analog converter, comprising method operations of:

providing a primary register frame, wherein each register of the primary register frame is serially linked;

identifying when the primary register frame contains a complete bit sequence;

converting a first portion of the complete bit sequence to a value representing an analog voltage; and decoding a second portion of the complete bit sequence to activate a pass gate corresponding to one of the multiple control knobs.

17. The method of claim 16, wherein the method operation of identifying when the primary register frame contains a complete bit sequence includes, triggering an enable signal to a plurality of pass gates corresponding to the multiple control knobs.

18. The method of claim 16, further comprising:

shifting bits within the primary register frame at each successive clock period;

identifying when the primary register frame contains another complete bit sequence; and repeating the converting and decoding for the another complete bit sequence.

19. A method of claim 16, wherein the first portion of bits represents a resolution of the single digital to analog converter and the second portion of bits is associated with a number of control knobs.

20. The method of claim 17, wherein the method operation of decoding a second portion of the complete bit sequence to activate a pass gate corresponding to one of the multiple control knobs includes, gating a signal representing the decoded second portion of the complete bit sequence with the enable signal.

* * * * *